United States Patent
Yoon

(10) Patent No.: US 7,999,276 B2
(45) Date of Patent: Aug. 16, 2011

(54) CHIP-TYPE LED PACKAGE AND LIGHT EMITTING APPARATUS HAVING THE SAME

(75) Inventor: Yeo Jin Yoon, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 114 days.

(21) Appl. No.: 12/298,238

(22) PCT Filed: May 7, 2007

(86) PCT No.: PCT/KR2007/002229
§ 371 (c)(1),
(2), (4) Date: Oct. 23, 2008

(87) PCT Pub. No.: WO2007/129847
PCT Pub. Date: Nov. 15, 2007

(65) Prior Publication Data
US 2009/0200567 A1      Aug. 13, 2009

(30) Foreign Application Priority Data
May 8, 2006  (KR) .................. 10-2006-0040855

(51) Int. Cl.
*H01L 29/22*    (2006.01)
*H01L 29/227*   (2006.01)
*H01L 33/00*    (2010.01)
*H01L 29/24*    (2006.01)
*H01L 31/0203*  (2006.01)
*H01L 23/29*    (2006.01)

(52) U.S. Cl. .......... 257/98; 257/100; 257/433; 257/789; 257/795; 257/E23.126; 257/E33.059

(58) Field of Classification Search ............ 257/100, 257/433, 789, 795, E23.126, 98, E33.059, 257/E33.59
See application file for complete search history.

(56) References Cited

U.S. PATENT DOCUMENTS
6,313,598 B1 * 11/2001 Tamba et al. ............. 318/722
(Continued)

FOREIGN PATENT DOCUMENTS
JP    2001-111115    4/2001
(Continued)

OTHER PUBLICATIONS
Office Action of Taiwanese Patent Application No. 96116264 issued on Mar. 1, 2011.

*Primary Examiner* — Ida M Soward
(74) *Attorney, Agent, or Firm* — H.C. Park & Associates, PLC

(57) ABSTRACT

Disclosed are a chip-type LED package and a light emitting apparatus having the same. The chip-type LED package includes a thermally conductive substrate with lead electrodes formed thereon. An LED chip is mounted on the thermally conductive substrate, and a lower molding portion covers the LED chip. In addition, an upper molding portion having hardness higher than that of the lower molding portion covers the lower molding portion. The upper molding portion is formed by performing transfer molding using resin powder. Accordingly, since the lower molding portion can be formed of a resin having hardness smaller than that of the upper molding portion, it is possible to provide a chip-type LED package in which device failure due to thermal deformation of the molding portion can be prevented.

19 Claims, 1 Drawing Sheet

U.S. PATENT DOCUMENTS

| | | | | |
|---|---|---|---|---|
| 6,339,255 | B1 * | 1/2002 | Shin | 257/686 |
| 6,686,676 | B2 * | 2/2004 | McNulty et al. | 313/112 |
| 6,741,029 | B2 | 5/2004 | Matsubara et al. | |
| 6,922,024 | B2 * | 7/2005 | Yano et al. | 315/291 |
| 7,023,019 | B2 * | 4/2006 | Maeda et al. | 257/89 |
| 7,129,577 | B2 * | 10/2006 | Maxwell | 257/707 |
| 7,145,253 | B1 * | 12/2006 | Kim et al. | 257/790 |
| 7,192,163 | B2 * | 3/2007 | Park | 362/294 |
| 7,210,807 | B2 * | 5/2007 | Sakamoto et al. | 362/84 |
| 7,304,326 | B2 * | 12/2007 | Suehiro et al. | 257/79 |
| 7,312,477 | B2 * | 12/2007 | Yatsuda et al. | 257/98 |
| 7,456,499 | B2 * | 11/2008 | Loh et al. | 257/710 |
| 7,517,728 | B2 * | 4/2009 | Leung et al. | 438/122 |
| 7,598,606 | B2 * | 10/2009 | Chow et al. | 257/686 |
| 7,608,862 | B2 * | 10/2009 | Sakuma et al. | 257/98 |
| 2002/0168798 | A1 * | 11/2002 | Glenn et al. | 438/110 |
| 2003/0039119 | A1 * | 2/2003 | Cao | 362/227 |
| 2003/0127722 | A1 * | 7/2003 | Nakaoka et al. | 257/686 |
| 2004/0227240 | A1 * | 11/2004 | Bolken et al. | 257/738 |
| 2005/0051782 | A1 * | 3/2005 | Negley et al. | 257/79 |
| 2005/0224829 | A1 * | 10/2005 | Negley et al. | 257/99 |
| 2005/0264194 | A1 * | 12/2005 | Ng et al. | 313/512 |
| 2006/0076883 | A1 * | 4/2006 | Himaki et al. | 313/503 |
| 2006/0186429 | A1 * | 8/2006 | Chew | 257/100 |
| 2006/0243995 | A1 * | 11/2006 | Hong et al. | 257/98 |
| 2006/0243996 | A1 * | 11/2006 | Ueda et al. | 257/98 |
| 2007/0029569 | A1 * | 2/2007 | Andrews | 257/99 |
| 2007/0045761 | A1 * | 3/2007 | Basin et al. | 257/440 |
| 2007/0114558 | A1 * | 5/2007 | Lam | 257/100 |
| 2007/0114562 | A1 * | 5/2007 | Radkov et al. | 257/103 |
| 2007/0138484 | A1 * | 6/2007 | Yamamoto et al. | 257/79 |
| 2007/0170454 | A1 * | 7/2007 | Andrews | 257/100 |
| 2007/0228387 | A1 * | 10/2007 | Negley et al. | 257/79 |
| 2007/0272839 | A1 * | 11/2007 | Schultz et al. | 250/227.31 |
| 2007/0278512 | A1 * | 12/2007 | Loh et al. | 257/99 |
| 2008/0023721 | A1 * | 1/2008 | Lee et al. | 257/99 |
| 2008/0128654 | A1 * | 6/2008 | Oshio | 252/301.4 R |
| 2008/0143246 | A1 * | 6/2008 | Hirosaki et al. | 313/503 |
| 2008/0157114 | A1 * | 7/2008 | Basin et al. | 257/98 |
| 2008/0194061 | A1 * | 8/2008 | Medendorp | 438/118 |
| 2008/0203414 | A1 * | 8/2008 | Yen et al. | 257/98 |
| 2009/0180273 | A1 * | 7/2009 | Kim et al. | 362/84 |
| 2009/0224277 | A1 * | 9/2009 | Leung et al. | 257/98 |

FOREIGN PATENT DOCUMENTS

| | | |
|---|---|---|
| KR | 10-0348377 | 7/2002 |
| KR | 10-2005-0029384 | 3/2005 |
| KR | 10-2006-0004569 | 1/2006 |

* cited by examiner

[Fig. 1]
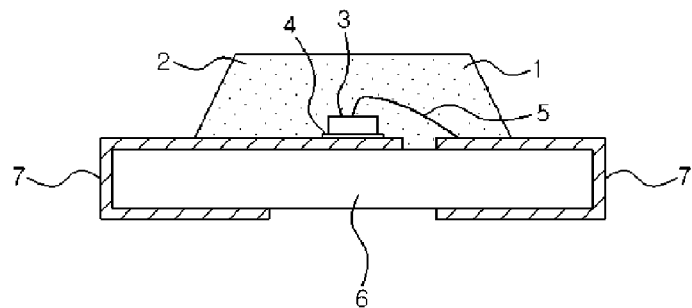
[Fig. 2]
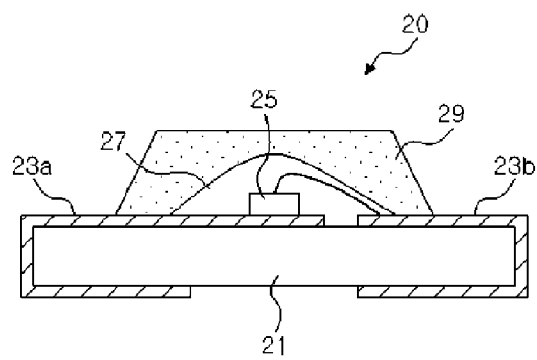
[Fig. 3]
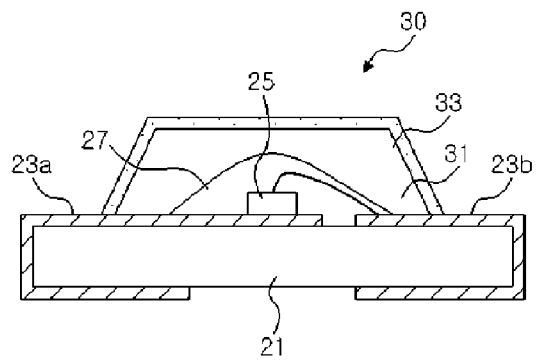
[Fig. 4]
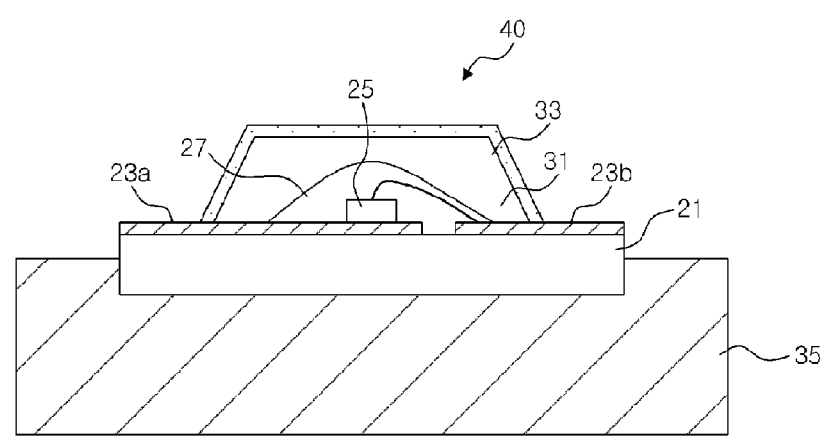

CHIP-TYPE LED PACKAGE AND LIGHT EMITTING APPARATUS HAVING THE SAME

CROSS REFERENCE TO RELATED APPLICATIONS

This application is the National Stage of International Application No. PCT/KR2007/002229, filed May 7, 2007, and claims priority from and the benefit of Korean Patent Application No. 10-2006-0040855, filed on May 8, 2006, which are both hereby incorporated by reference for all purposes as if fully set forth herein.

BACKGROUND OF THE INVENTION

1. Field of the Invention

The present invention relates to a light emitting diode (LED) package and a light emitting apparatus having the same, and more particularly, to a chip-type LED package and a light emitting apparatus having the same.

2. Discussion of the Background

Generally, a chip-type LED package includes an LED chip mounted on a printed circuit board (PCB) and a molding portion covering the LED chip. The molding portion contains a phosphor to convert the wavelength of light emitted from the LED chip. For example, the LED chip may be a gallium nitride-based compound semiconductor capable of emitting ultraviolet or blue light, and the phosphor converts the ultraviolet or blue light into light with another color. Accordingly, it is possible to implement light with various colors, particularly white light, by combining the LED chip with the phosphor.

Since this chip-type LED package has a very simple structure, a manufacturing process is simplified and it is possible to mass-produce light, thin, simple and small products. Accordingly, the chip-type LED package is widely used for various application products that require small light sources, for example, as a backlight source for a liquid crystal display (LCD) of a mobile communication terminal.

Conventionally, the molding portion containing the phosphor is formed by dotting or casting a liquid epoxy resin containing the phosphor onto a PCB. However, since an inorganic phosphor has relatively greater specific gravity than the liquid epoxy resin, the phosphor precipitates within the liquid epoxy resin. Accordingly, since the phosphor is irregularly dispersed within the molding portion, it is not possible to provide an LED package with uniform luminance.

Meanwhile, Korean Patent No. 10-0348377 discloses a method of manufacturing a chip-type LED package having a molding portion with a phosphor uniformly dispersed therein. FIG. 1 is a sectional view illustrating the method of manufacturing a chip-type LED package disclosed in the Korean patent.

Referring to FIG. 1, an LED chip 3 is mounted on a PCB 6 with lead electrodes 7 printed thereon. The LED chip 3 is mounted on and electrically connected to any one of the lead electrodes 7 using a conductive adhesive 4 and is also electrically connected to the other of the lead electrodes 7 by means of a bonding wire 5.

Meanwhile, a molding portion 1 containing a phosphor 2 covers the LED chip 3. The molding portion 1 is formed by making a tablet out of a mixture of the phosphor 2 and solid resin powder and then performing transfer molding using the tablet. During transfer molding, the molding portion is formed by curing a resin within a short period of time at a temperature relatively higher than a general curing temperature. It is possible to prevent precipitation of the phosphor 2 within the molding portion 1 due to a difference in specific gravity, resulting in the molding portion 1 with the phosphor 2 uniformly dispersed therein. Accordingly, it is possible to provide a chip-type LED package having uniform luminance due to the molding portion 1 with the phosphor 2 uniformly dispersed therein.

The molding portion 1 has a high hardness in order to protect the LED chip against external forces and other environmental hazards. However, where the molding portion 1 covering the LED chip has a high hardness, the molding portion 1 may be deformed due to thermal stress generated during operation of the LED chip. The deformation of the molding portion 1 causes variations in light emitting luminance and also causes separation of the molding portion 1 from the PCB 6, thereby shortening the life span of the LED package.

In order to meet development of color realization and demand for enhancing LCD brightness, a chip-type LED package with high output power may be used as a backlight source. To this end, a chip-type LED package on which a power chip operating at a relatively significantly higher current such as about 350 mA, compared with a conventional LED chip operating at about 20 mA, is mounted. However, an increase of the operating current increases heat generation from the LED chip, and thus, the molding portion is more deformed. In addition, since a PCB made of glass epoxy with low thermal conductivity cannot rapidly dissipate heat generated from the LED chip, the thermal deformation of the molding portion is further promoted.

SUMMARY OF THE INVENTION

The present invention provides a chip-type LED package and a light emitting apparatus in which it is possible to prevent device failure due to thermal deformation of a molding portion.

The present invention provides a chip-type LED package having a uniform luminance characteristic, and a light emitting apparatus having the same.

The present invention provides a chip-type LED package in which a power chip operating at a high current can be mounted and operated, and a light emitting apparatus having the same.

The present invention provides a chip-type LED package that includes a thermally conductive substrate with lead electrodes formed thereon. An LED chip is mounted on the thermally conductive substrate, and a lower molding portion covers the LED chip. In addition, an upper molding portion having hardness higher than that of the lower molding portion covers the lower molding portion. The upper molding portion is formed by performing transfer molding using resin powder. Accordingly, since the lower molding portion can be formed of a resin having hardness smaller than that of the upper molding portion, it is possible to prevent deterioration of a device due to thermal deformation of the molding portion.

Meanwhile, the upper molding portion may be formed by performing the transfer molding using a mixture of resin powder and phosphor, so that the upper molding portion can contain the phosphor uniformly dispersed therein. Accordingly, it is possible to provide a chip-type LED package representing uniform luminance.

The thermally conductive substrate transfers heat generated from the LED chip to the outside, thereby promoting heat dissipation. The thermally conductive substrate may be a metal core printed circuit board (MCPCB) or a ceramic substrate. The ceramic may be, for example, alumina ($Al_2O_3$), silicon carbide (SiC) or aluminum nitride (AlN).

The lower molding portion is not needed to contain a phosphor with specific gravity larger than that of a resin. Thus, the lower molding portion may be formed by dotting a liquid resin, for example, a silicone resin.

An intermediate molding portion may be interposed between the lower and upper molding portions. The intermediate molding portion preferably has the same shape as the upper molding portion. As a result, the upper molding portion is formed to have a generally uniform thickness on the intermediate molding portion. Accordingly, the lengths of optical paths passing through the upper molding portion become substantially identical with one another, thereby improving luminance uniformity. The intermediate molding portion may be formed by performing transfer molding using resin powder.

Another aspect of the present invention provides a light emitting apparatus having the chip-type LED package. The light emitting apparatus includes a heat-sink slug. The chip-type LED package is mounted on the heat-sink slug. Accordingly, heat dissipation from the LED package is promoted through the heat-sink slug.

The heat-sink slug may have a recess, and the thermally conductive substrate of the chip-type LED package is mounted in the recess. The recess determines a mounting position of the chip-type LED package, and also fixes the chip-type LED package.

According to the present invention, it is possible to provide a chip-type LED package which has a uniform luminance characteristic and in which device failure due to thermal deformation of a molding portion can be prevented, and a light emitting apparatus having the same. In addition, it is possible to provide a chip-type LED package in which a power chip operating at a high current can be mounted and operated, and a light emitting apparatus having the same.

BRIEF DESCRIPTION OF THE DRAWINGS

FIG. 1 is a sectional view showing a conventional chip-type LED package.

FIG. 2 is a sectional view showing a chip-type LED package according to an embodiment of the present invention.

FIG. 3 is a sectional view showing a chip-type LED package according to another embodiment of the present invention.

FIG. 4 is a sectional view showing a light emitting apparatus having the chip-type LED package according to an embodiment of the present invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements throughout the specification.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 2 is a sectional view showing a chip-type LED package 20 according to an embodiment of the present invention.

Referring to FIG. 2, the chip-type LED package 20 includes a thermally conductive substrate 21 with lead electrodes 23a and 23b formed thereon. The thermally conductive substrate 21 may be a metal core printed circuit board (MCPCB) or a ceramic substrate. The ceramic may be, for example, alumina ($Al_2O_3$), silicon carbide (SiC) or aluminum nitride (AlN). The lead electrodes 23a and 23b are formed on an upper surface of the substrate 21 and may extend in various manners depending on uses thereof. For example, the lead electrodes 23a and 23b may extend to a lower surface of the substrate 21 as shown in FIG. 2 so that they can be surface-mounted.

An LED chip 25 is mounted on the thermally conductive substrate 21. The LED chip 25 is bonded to the lead electrode 23a by means of a conductive adhesive (not shown) and electrically connected to the lead electrode 23b by means of a bonding wire. Here, the LED chip 25 represents a 1-bond die having an electrode on each of upper and lower surfaces thereof. Alternatively, the LED chip 25 may be a 2-bond die having two electrodes on an upper surface thereof. In this case, the electrodes are electrically connected to the lead electrodes 23a and 23b by means of bonding wires. In addition, the LED chip 25 may be a flip chip having bumps. In this case, the LED chip may be flip-bonded to the lead electrodes 23a and 23b using the bumps.

A lower molding portion 27 covers the LED chip 25. The lower molding portion 27 may be formed by dotting a silicone resin. At this time, the silicone resin preferably does not contain a phosphor. The lower molding portion has relatively low hardness and thus absorbs thermal stress caused by heat generated from the LED chip 25. Accordingly, the lower molding portion 27 is prevented from being separated from the LED chip 25 or the substrate 21.

Meanwhile, an upper molding portion 29 covers the lower molding portion 27. The upper molding portion has hardness relatively higher than that of the lower molding portion 27, so that it protects the LED chip 25 from external environments such as an external force. The upper molding portion 29 may contain a phosphor for converting the wavelength of light emitted from the LED chip 25. The LED chip 25 and the phosphor are combined to implement various colors, for example, white light.

The upper molding portion 29 may be formed by performing transfer molding using resin powder. That is, a tablet is made using the resin powder, and the transfer molding is performed using the tablet, thereby forming the upper molding portion 29. At this time, the transfer molding may be performed using a mixture of resin powder and phosphor to form the upper molding portion 29. Accordingly, there is provided a chip-type LED package having uniform luminance, wherein the upper molding portion 29 containing the phosphor uniformly dispersed therein is formed.

Although it has been illustrated in this embodiment that the single LED chip 25 is mounted on the single substrate 21, the present invention is not limited thereto. A plurality of LED chips 25 may be mounted in an array on a single substrate 21. At this time, the lower molding portion 27 and the upper molding portion 29 may be formed to cover the plurality of LED chips 25, respectively.

FIG. 3 is a sectional view showing a chip-type LED package 30 according to another embodiment of the present invention.

Referring to FIG. 3, the chip-type LED package 30 is substantially identical with the chip-type LED package 20 of FIG. 2. Thus, the following description will be made in connection with differences therebetween.

In this embodiment, an intermediate molding portion 31 is interposed between an upper molding portion 33 and a lower molding portion 27. That is, the intermediate molding portion 31 covers the lower molding portion 27, and the upper molding portion 33 covers the intermediate molding portion 31. The intermediate molding portion 31 may be formed by performing transfer molding using resin powder, and the upper molding portion 33 may be formed in the same manner as the upper molding portion 29 of FIG. 2.

The intermediate molding portion 31 may have the generally same shape as the upper molding portion 33 but preferably does not contain a phosphor. The upper molding portion 33 is formed to have a substantially uniform thickness on the intermediate molding portion 31. As a result, the lengths of optical paths of light that is generated from the LED chip 25 and passes through the upper molding portion 33 become substantially identical with one another regardless of positions in the upper molding portion 33. Thus, in a case where the upper molding portion 33 contains a phosphor, the wavelength of light can be more uniformly converted due to the phosphor, so that the luminance uniformity of the chip-type LED package 30 is more improved.

FIG. 4 is a sectional view showing a light emitting apparatus 40 having the chip-type LED package of the present invention.

The light emitting apparatus 40 has the chip-type LED package 20 or 30 described with reference to FIG. 2 or 3. Here, the following description will be made in connection with the light emitting apparatus 40 having the chip-type LED package 30 of FIG. 3.

The chip-type LED package 30 is mounted on a heat-sink slug 35. The thermally conductive substrate 21 of the chip-type LED package 30 is mounted on the heat-sink slug 35. At this time, the thermally conductive substrate 21 may be bonded to the heat-sink slug 35 by means of a thermally conductive adhesive (not shown).

The heat-sink slug 35 may be made of a material with high thermal conductivity, for example, metal. In the case where the heat-sink slug 35 is made of a conductive material such as metal, at least one of the lead electrodes 23a and 23b of the chip-type LED package 30 is insulated from the heat-sink slug 35. To this end, the lead electrodes 23a and 23b may be defined on the substrate 21, as shown in FIG. 4.

Meanwhile, the heat-sink slug 35 may have a recess, and the thermally conductive substrate 21 may be engaged with the recess of the heat-sink slug 35 as shown in the figure. The recess facilitates alignment of the chip-type LED package 30 and also fixes the chip-type LED package 30.

Meanwhile, lead terminals (not shown) for connecting the lead electrodes 23a and 23b to an external power source may be provided, and the lead terminals and the lead electrodes 23a and 23b may be electrically connected to each other in various manners, for example, by means of bonding wires (not shown) or welding.

Although a power-type LED package with an LED chip mounted on a heat sink is generally on the market, it is difficult to provide a molding portion with a phosphor uniformly dispersed therein since such an LED package is difficult to form the molding portion by means of transfer molding. However, since the chip-type LED package 30 is mounted on the heat-sink slug 35 in this embodiment, it is possible to provide a molding portion with a phosphor uniformly dispersed therein by means of the transfer molding technique. Accordingly, it is possible to provide a light emitting apparatus with improved luminance uniformity.

The invention claimed is:

1. A chip-type light emitting diode (LED) package, comprising:
    a thermally conductive substrate with lead electrodes formed thereon;
    an LED chip mounted on the thermally conductive substrate;
    a lower molding portion covering the LED chip; and
    an upper molding portion covering the lower molding portion, the upper molding portion having hardness higher than that of the lower molding portion and contains a phosphor uniformly dispersed therein,
    wherein the lead electrodes comprise a first electrode and a second electrode formed on a top surface of the thermally conductive substrate,
    wherein the upper molding portion contacts portions of the lead electrodes formed on the top surface of the thermally conductive substrate, and
    wherein the upper molding portion is wider where it contacts the lead electrodes than at its upper surface.

2. The chip-type LED package as claimed in claim 1, wherein the thermally conductive substrate is a metal core printed circuit board (MCPCB) or a ceramic substrate.

3. The chip-type LED package as claimed in claim 1, wherein the lower molding portion does not contain a phosphor.

4. The light emitting apparatus as claimed in claim 1, wherein the lower molding portion contacts portions of the lead electrodes formed on the top surface of the thermally conductive substrate.

5. The chip-type LED package as claimed in claim 1, wherein the entire upper surface of the upper molding portion is exposed from a point where it contacts the first lead electrode to the point where it contacts the second lead electrode.

6. The chip-type LED package as claimed in claim 1, further comprising an intermediate molding portion interposed between the lower and upper molding portions and having the same shape as the upper molding portion.

7. The chip-type LED package as claimed in claim 6, wherein the intermediate molding portion does not contain a phosphor.

8. The light emitting apparatus as claimed in claim 1,
    wherein the LED chip is mounted on the top surface of the thermally conductive substrate, and
    wherein the lower molding portion and the upper molding portion both directly contact portions of the first electrode and the second electrode formed on the top surface of the thermally conductive substrate.

9. The light emitting apparatus as claimed in claim 8, wherein the upper molding portion comprises a substantially uniform thickness.

10. A light emitting apparatus, comprising:
    a heat-sink slug with a thermally conductive substrate mounted thereon;
    the thermally conductive substrate with lead electrodes formed thereon;
    an LED chip mounted on the thermally conductive substrate;
    a lower molding portion covering the LED chip; and
    an upper molding portion covering the lower molding portion, the upper molding portion having a hardness higher than that of the lower molding portion and containing a phosphor uniformly dispersed therein, wherein the lead electrodes comprise a first electrode and a second electrode formed on a top surface of the thermally conductive substrate, wherein the upper molding portion contacts portions of the lead electrodes formed on the top surface of the thermally conductive substrate, and wherein the upper molding portion is wider where it contacts the lead electrodes than at its upper surface.

11. The light emitting apparatus as claimed in claim 10, wherein the heat-sink slug has a recess, and the thermally conductive substrate is mounted in the recess.

12. The light emitting apparatus as claimed in claim 10, wherein the thermally conductive substrate is a metal core printed circuit board (MCPCB) or a ceramic substrate.

13. The light emitting apparatus as claimed in claim 10, wherein the lower molding portion does not contain the phosphor.

14. The light emitting apparatus as claimed in claim 10, wherein the lower molding portion contacts portions of the lead electrodes formed on the top surface of the thermally conductive substrate.

15. The light emitting apparatus of claim 10, wherein the entire upper surface of the upper molding portion is exposed from a point where it contacts the first lead electrode to the point where it contacts the second lead electrode.

16. The light emitting apparatus as claimed in claim 10, further comprising an intermediate molding portion interposed between the lower and upper molding portions and having the same shape as the upper molding portion.

17. The light emitting apparatus as claimed in claim 16, wherein the lower molding portion and the intermediate molding portion do not contain the phosphor.

18. The light emitting apparatus as claimed in claim 10,
wherein the LED chip is mounted on the top surface of the thermally conductive substrate, and
wherein the lower molding portion and the upper molding portion both directly contact portions of the first electrode and the second electrode formed on the top surface of the thermally conductive substrate.

19. The light emitting apparatus as claimed in claim 18, wherein the upper molding portion comprises a substantially uniform thickness.

* * * * *